United States Patent [19]

Caya et al.

[11] Patent Number: 4,831,280

[45] Date of Patent: May 16, 1989

[54] HIGH VOLTAGE PULSE GENERATING APPARATUS

[75] Inventors: Arthur J. Caya, Ashland; Paul A. Beck, Marlboro, both of Mass.

[73] Assignee: Raytheon Company, Lexington, Mass.

[21] Appl. No.: 167,813

[22] Filed: Mar. 14, 1988

[51] Int. Cl.[4] .................. H03K 3/017; H03K 3/02; H03K 5/13; H03K 5/04
[52] U.S. Cl. .................................. 307/265; 307/268; 307/585; 307/246
[58] Field of Search ............... 307/260, 246, 168, 170, 307/37, 38, 41, 85, 640, 633, 106, 43, 72, 75, 262, 268, 571, 579, 585, 265; 328/59, 60, 61

[56] References Cited

U.S. PATENT DOCUMENTS

| | | | |
|---|---|---|---|
| 3,271,700 | 3/1963 | Gutzwiller | 307/633 |
| 3,932,772 | 1/1976 | Graves | 307/268 |
| 4,677,317 | 6/1987 | Sakuma | 307/270 |
| 4,677,324 | 6/1987 | Ronan, Jr. et al. | 307/571 |
| 4,697,096 | 9/1987 | Conrad et al. | 307/246 |

OTHER PUBLICATIONS

*Radar Handbook*, by Merrill I. Skolnik, Copyright 1970, published by McGraw-Hill, Inc., pp. 7-81.

Primary Examiner—Stanley D. Miller
Assistant Examiner—Nancy Thai
Attorney, Agent, or Firm—Edmund J. Walsh; Richard M. Sharkansky

[57] ABSTRACT

A high voltage modulator is shown to be made up of: (a) a square wave generator adapted to produce signals with adjustable duty cycles at different repetition frequencies; (b) a pair of switching transistor assemblies arranged to connect either a high positive voltage or a high negative voltage to an output line; and (c) switch actuating circuitry optically coupled to the square wave generator to produce actuating signals for the pair of switching transistor assemblies in accordance with the signals out of the square wave generator, the switch actuating circuitry further being adapted to reduce to a minimum the time during which the high positive and high negative voltages may simultaneously be connected to the output line.

9 Claims, 5 Drawing Sheets

HIGH VOLTAGE PULSE GENERATING APPARATUS

BACKGROUND OF THE INVENTION

This invention pertains generally to the generation of high voltage pulses, and more particularly to the generation of high voltage pulses at a high pulse repetition frequency such as would be useful in a pulsed radar system.

In some pulsed radar systems, voltage pulses are applied to a controlling element of a klystron or microwave power tube to produce the radar pulses to be transmitted. High voltage pulses must be used in order to produce sufficiently powerful transmitted radar pulses. In a typical pulsed radar system using a gridded tube the pulses applied to the controlling element might have peak-to-peak amplitudes of several hundred volts. Therefore, circuitry capable of generating high voltage pulses is required.

Typically, a low voltage pulse train having the pulse repetition frequency and duty cycle desired for the transmitted radar pulses is first generated. Relatively common digital logic may be used to generate the low voltage pulse train that is then converted t the requisite high voltage pulse train by a step-up transformer, or a combination of step-up transformers.

The use of one or more step-up transformers to generate high voltage pulses suffers from several limitations. First, transformers generally have fixed limited bandwidths such that a pulsed radar system using transformers to transmit radar pulses at one pulse repetition frequency could not be used to transmit radar pulses at a significantly different pulse repetition frequency. Secondly, transformers generally are duty cycle limited and do not pass signals with high duty cycles. In pulsed Doppler radar systems, high pulse repetition frequencies must be used to accurately track fast targets. The maximum duty cycle of the transformer limits the maximum pulse repetition frequency for a fixed pulsewidth and hence the maximum speed of a target which can be accurately tracked.

SUMMARY OF THE INVENTION

With the just described background in mind, it is an object of this invention to provide improved apparatus for generating high voltage pulses.

It is a further object of this invention to provide improved apparatus for generating high voltage pulses at a high pulse repetition frequency.

It is yet another object of this invention to provide apparatus for generating high voltage pulses with high duty cycles and a high pulse repetition frequency.

The foregoing and other objects are accomplished by apparatus for producing high voltage pulses on an output line, the apparatus comprising: (a) means for generating low voltage pulses with the desired pulse repetition frequency and duty cycle; (b) first controller means, responsive to the means for generating low voltage pulses, for operating a first switch to connect the output line to a positive high voltage source when the first switch is in a closed state and disconnecting the output line from the positive high voltage source when the first switch is in an open state; and (c) second controller means, also responsive to the means for generating low voltage pulses, for operating a second switch to connect the output line to a negative high voltage source when the second switch is in a closed state and disconnecting the output line from the negative high voltage source when the second switch is in an open state. The first and second controller means are constructed so that, when the voltage on the output line is to change from a high negative voltage to a high positive voltage, the second switch opens slightly before the first switch closes and, when the voltage on the output line is to change from a high positive voltage to a high negative voltage, the first switch opens and the second switch closes at substantially the same instant.

BRIEF DESCRIPTION OF THE DRAWINGS

The present invention will be more fully understood by reference to the following detailed description and the FIGURES in which.

DESCRIPTION OF THE PREFERRED EMBODIMENT

Figure 1:
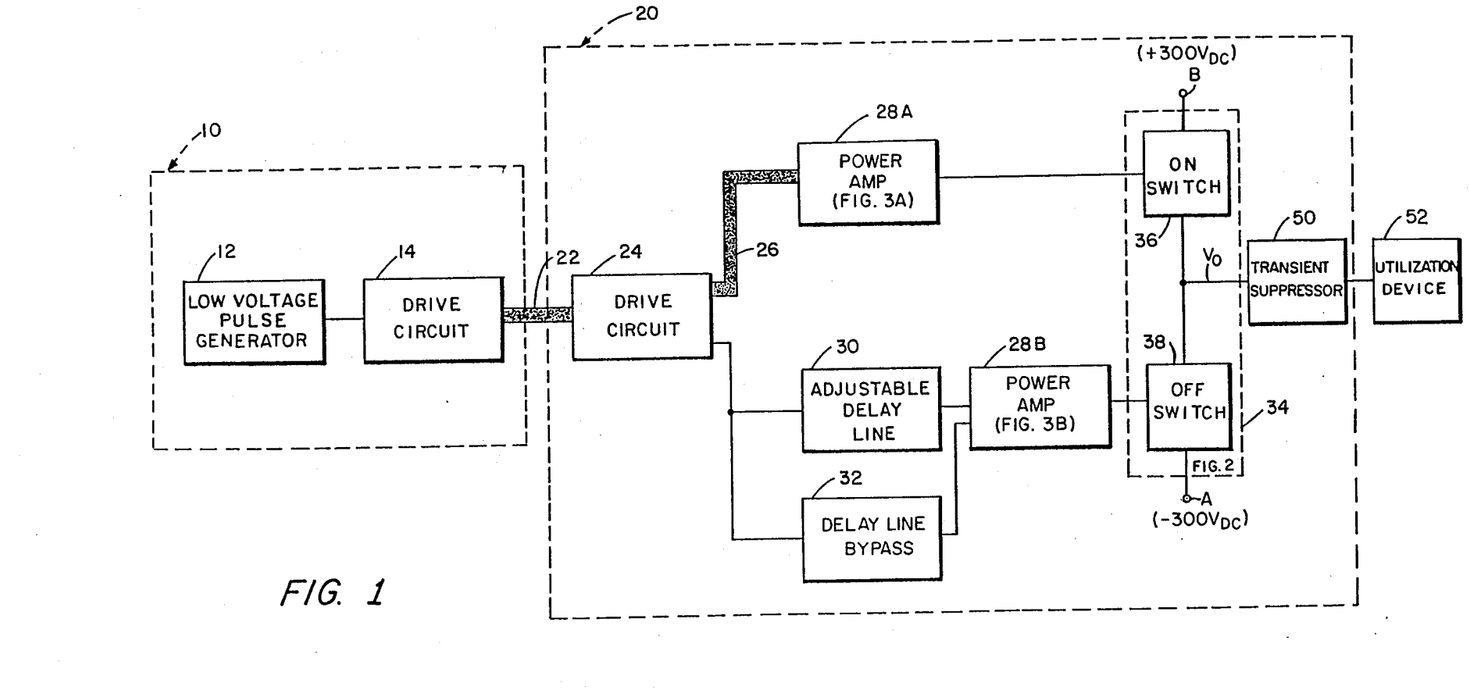
FIG. 1 is a block diagram of a high voltage pulse generator constructed in accordance with the present invention.

FIG. 1 shows a block diagram of a high voltage, high pulse repetition frequency (PRF) pulse generator incorporating the inventive concept here to be discussed. Low voltage circuitry 10 produces a train of low voltage pulses at the desired PRF and duty cycle. Fiber optic link 22 couples the pulse train to high voltage circuitry 20. High voltage circuitry 20 amplifies the pulse train to form high voltage pulses. The output of the high voltage circuitry 20 drives some utilization device 52. In one proposed use of the high voltage, high PRF pulse generator, utilization device 52 represents a gridded klystron tube.

Low voltage circuitry 10 is comprised largely of commercially available transistor-transistor-logic (TTL) components. TTL components can be used because fiber optic link 22 isolates low voltage circuitry 10 from the high supply voltages used in high voltage circuitry 20.

Low voltage pulse generator 12 forms the low voltage pulse train, employing any known means to produce a pulse train. For example, the use of digital counters in conjunction with a crystal oscillator is a well known method for producing a pulse train.

Drive circuit 14 connects low voltage pulse generator 12 to fiber optic link 22 wherein each low voltage pulse is converted to a light pulse. The means for converting electrical pulses to light pulses and for coupling light pulses to a fiber optic link are known in the art. Here, part number QFBR-1496 from Hewlett-Packard of Palo Alto, Calif. may be used.

Figure 3A:
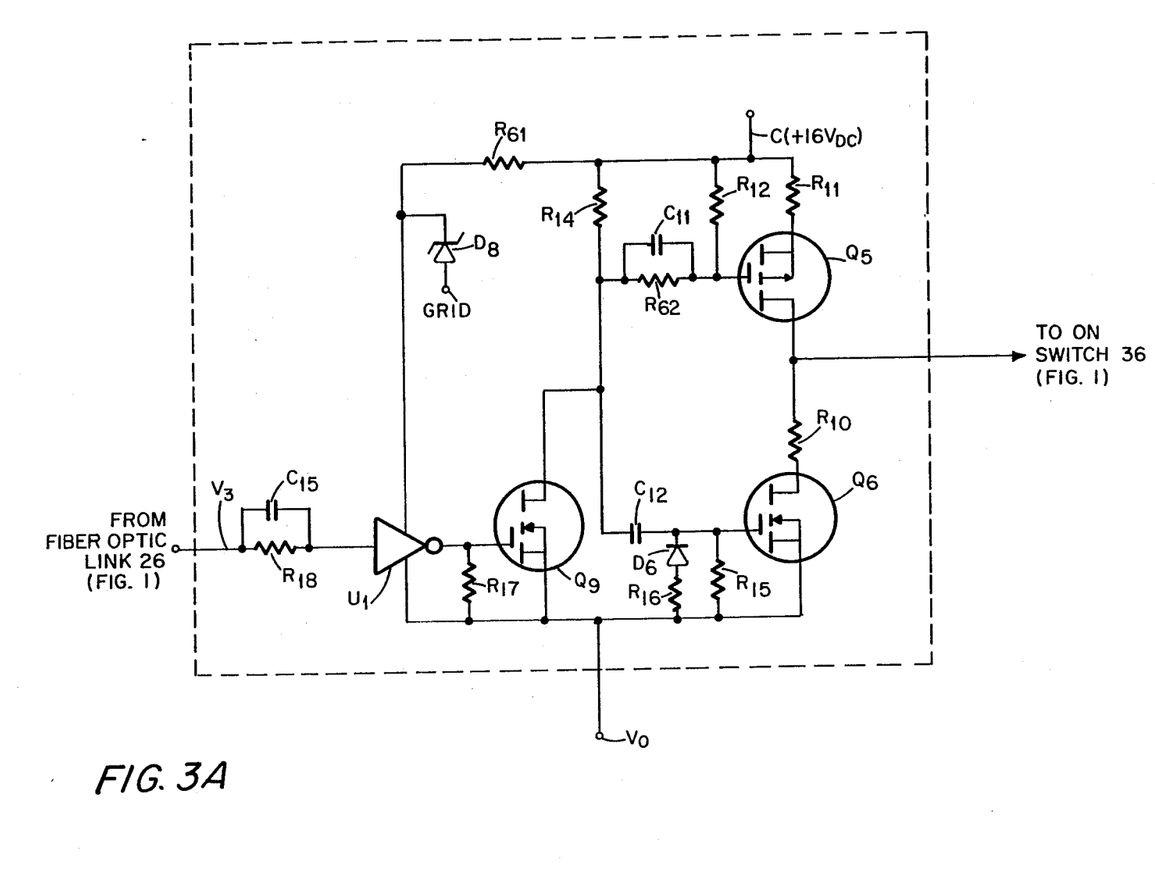
FIG. 3A is a simplified schematic of the power amplifier 28A shown in FIG. 1.

Fiber optic link 22 electrically decouples low voltage circuitry 10 from high voltage circuitry 20. Thus, the supply voltages used to drive the low voltage circuitry 10 may be referenced to any convenient voltage. The voltages in high voltage circuitry 20 may also be referenced to any convenient voltage. Here, high voltage circuitry 20 has a −300 V supply (element A, FIG. 1)

referenced to "ground" (here "ground" refers to any voltage used as cathode potential of the microwave tube), a +300 V supply referenced to ground (element B, FIG. 1), a +5 V supply referenced to the −300 $V_o$ supply (not shown), a +16 V supply referenced to −300 V supply (element D, FIG. 3B), a +5 V supply referenced to an output line $V_o$ (not shown), and a +16 V supply referenced to the output line Vo (element C, FIG. 3A).

Drive circuit 24 receives the light pulses from fiber optic link 22 and converts such light pulses to voltage pulses (referenced to the −300 V d.c. supply but at a relatively low voltage, here approximately 5V.) The means for converting light pulses to voltage pulses is known in the art. Here, part number QFBR-2496 from Hewlett-Packard was used The low voltage pulses referenced to −300 V out of drive circuit 24 are divided and passed on three different paths, as shown. Thus, such pulses are provided as inputs to an adjustable delay line 30 and a delay line bypass 32 and are also reconverted to light pulses and are provided as an input, via a fiber optic link 26, to a power amplifier 28A. Because the pulses operated on by drive circuit 24 are relatively low voltage, though referenced to −300 V, known low voltage circuits may be used.

Power amplifier 28A receives the light pulses from fiber optic link 26 and converts such pulses to voltage pulses. The pulses may be slightly delayed in the path to power amplifier 28A, especially because of the delays in converting the voltage pulses to and from light pulses. However, such delays are compensated for in a manner described below. The pulses are still at a relatively low voltage, but are now referenced to the circuit output line $V_o$. Power amplifier 28A then amplifies the voltage pulses from a peak voltage of around 5 V referenced to output line $V_o$ to a peak voltage of around 16 V still referenced to $V_o$. Further details of the construction of power amplifier 28A are provided below in conjunction with FIG. 3A.

Adjustable delay line 30 also receives low voltage pulses from drive circuit 24. The output of adjustable delay line 30 then consists of low voltage pulses delayed in time. Delay lines such as part number LF10M1 from Technitrol of Philadelphia, Pa. are commercially available. The aforementioned commercially available component has multiple taps from which the output may be taken. The connection of the output of adjustable delay line 30 to a particular tap sets the delay of adjustable delay line 30.

Delay line bypass 32 also receives the low voltage pulses from drive circuit 24, such low voltage pulses being passed through the delay line bypass 32 without any significant delay. Standard TTL circuitry, powered by 15 the supply +5 V referenced to the −300 V supply, may be used to construct delay line bypass 32.

The outputs of both adjustable delay line 30 and delay line bypass 32 are inputs to power amplifier 28B. Power amplifier 28B has a logic low (i.e., a negative pulse) output whenever the output of adjustable delay line 30 or delay line bypass 32 (i.e., the inputs to power amplifier 28B) is a logic high. The width of each pulse at the output of power amplifier 28B is at least as wide as each pulse applied to power amplifier 28B. The output pulse may be wider, though, because the the length of time when either of the inputs is high is longer than the time when just one of them is high. The relative widths of the pulses is shown in more detail below in conjunction with FIG. 4.

The pulse at the output of power amplifier 28B has a peak value near 16 V referenced to the −300 V supply A. However, the output of power amplifier 28B is inverted (i.e., it is near 16 V when there is no pulse and near 0 V when there is a pulse). The operation of power amplifier 28B is shown in more detail below in connection with FIG. 3B.

The pulses produced by power amplifiers 28A and 28B drive output stage 34. When the output of power amplifier 28A is high, ON switch 36 is closed, thereby connecting the output line $V_o$ to the +300 V supply B. When the output of power amplifier 28B is high, OFF switch 38 is closed, thereby connecting the output line $V_o$ to the −300 V supply A. Thus, by proper control of outputs of power amplifiers 28A and 28B, the output line $V_o$ may be made to change from −300 V and +300 V. The details of output stage 34 are provided below in conjunction with FIG. 2.

The output line $V_o$ is connected to a transient suppressor 50 that in turn is connected to a utilization device 52. Transient suppressor 50 protects high voltage circuit 20 from high voltage arcs generated in utilization device 52. Various types of transient suppressors are known in the art. Here, a sparkgap such as part number MLH-0500L from Reynolds Industries of Los Angeles, Calif. is used in conjunction with discrete diodes and resistors.

Figure 2:
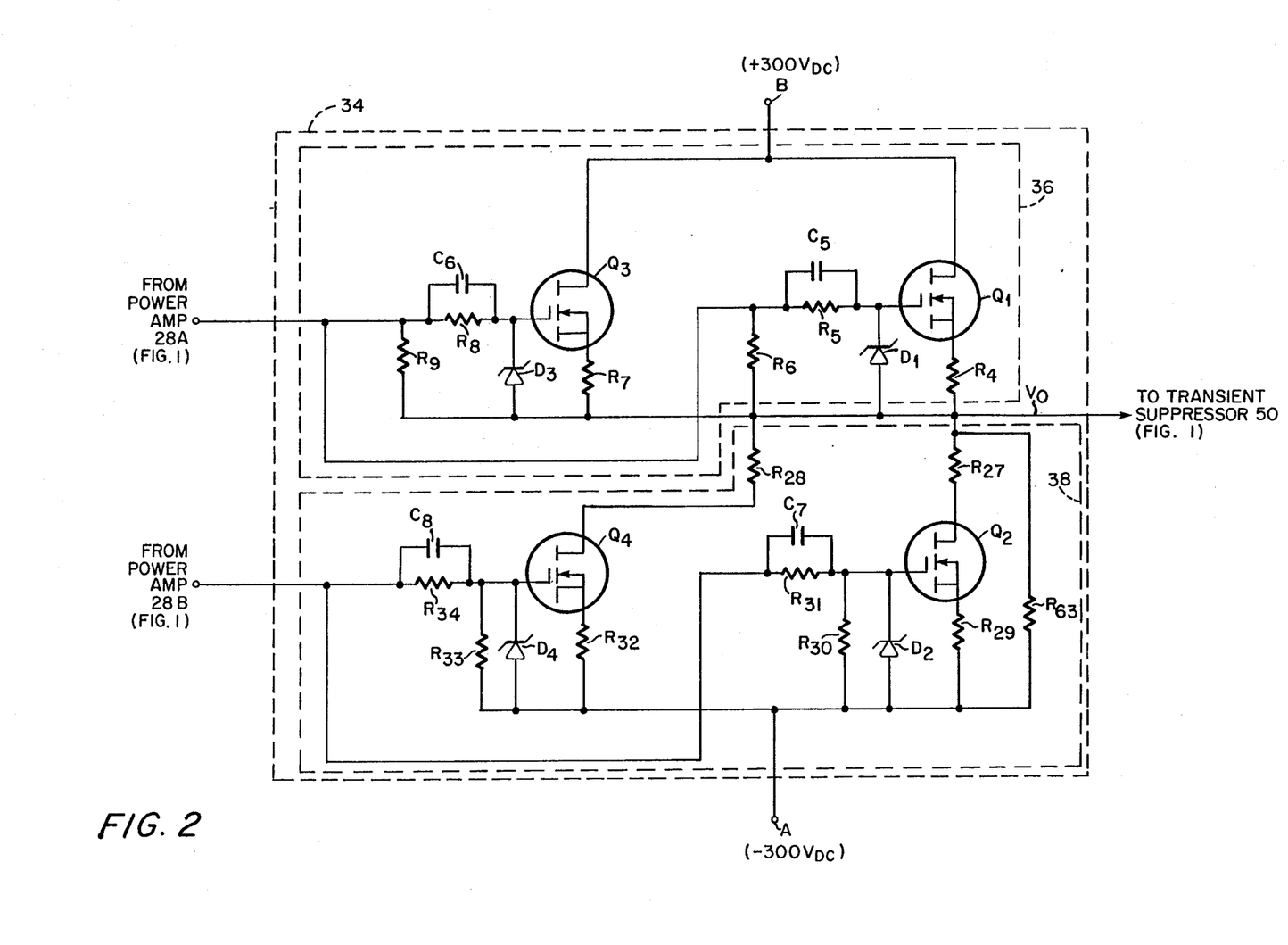
FIG. 2 is a simplified schematic of the output stage of the high voltage pulse generator shown in FIG. 1.

Turning to FIG. 2, the details of output stage 34 can be seen. ON switch 36 consists of MOSFET $Q_1$ and MOSFET $Q_3$ connected in parallel. The parallel arrangement increases the current handling capacity of the switch. High current handling capacity is needed to overcome the capacitive reactance of utilization device 52 and thereby allow the circuit to operate at a high PRF. One skilled in the art will recognize that resistors $R_4$, $R_5$, $R_6$, $R_7$, $R_8$, $R_9$, capacitors $C_5$, $C_6$ and diodes $D_1$ and $D_3$ bias MOSFETS $Q_1$ and $Q_3$.

OFF switch 38 consists of MOSFET $Q_2$ and MOSFET $Q_4$ connected in parallel. One skilled in the art will recognize resistors $R_{29}$, $R_{30}$, $R_{31}$, $R_{32}$, $R_{33}$, $R_{34}$, capacitors $C_7$, $C_8$ and diodes $D_2$ and $D_4$ are needed to bias MOSFETs $Q_2$ and $Q_4$. MOSFETs $Q_1$, $Q_2$, $Q_3$ and $Q_4$ are power transistors such as model number BUZ53A manufactured by Siemens of the Federal Republic of Germany.

The design of output stage 34 enables rapid switching between the +300 V and −300 V supplies. When connecting the +300 V supply to the output line $V_o$, OFF switch 38 should be open (i.e., $Q_2$ and $Q_4$ should not conduct). Conversely, when the −300 V supply is to be connected to the output line $V_o$, OFF switch 38 should be closed and ON switch 36 should be open. To make a pulse on output line $V_o$ with a short rise time, ON switch 36 should close at precisely the same moment that OFF switch 38 opens. Similarly, to make a pulse with a short fall time, ON switch 36 should open at precisely the same moment that OFF switch 38 closes.

However, opening and closing of ON switch 36 and OFF switch 38 can not be precisely timed. The switching of drive circuit 34 is controlled by signals out of power amplifiers 28A and 28B (FIG. 1). Even though the inputs to both power amplifiers 28A and 28B (FIG. 1) are derived from a common source, namely drive circuit 24 (FIG. 1), the signal propagation delays through power amplifiers 28A and 28B (FIG. 1) are not equal. One source of the difference is fiber optic link 26 (FIG. 1). Additionally, even if the control signals reached ON switch 36 and OFF switch 38 at precisely the same time, the transistor circuit shown in FIG. 2 could not switch instantaneously. On both the rising and falling edge of a pulse, output stage 34 would be in a state where ON switch 36 and OFF switch 38 were both partially conducting. The simultaneous conduction of both ON switch 36 and OFF switch 38 presents two problems which can be understood by reference to FIG. 1. First, simultaneous conduction reduces the amount of current flow available to overcome the capacitive reactance of utilization device 52. That decrease increases the time required for output line $V_o$ to switch between $-300$ V and $+300$ V which in turn limits the bandwidth of the apparatus. For example, when the output Vo is to switch from a low voltage to a high voltage, the capacitive reactance of utilization device 52 is overcome by "charging up" the input capacitance of the utilization device 52 with current flowing through ON switch 36. If OFF switch 38 is simultaneously conducting, less current is available to charge up utilization device 52 and the charging takes longer. Second, simultaneous conduction means that a low impedance path for current flow exists between the $+300$ V d.c. supply B and the $-300$ V d.c. supply A through ON switch 36 and OFF switch 38. The high current flow thus resulting may exceed the current handling capacity of those switches and therefore damage the switches. Generally, switches capable of handling such large currents tend to have slow switching times and can not be used for switches 36 and 38.

Figure 4:
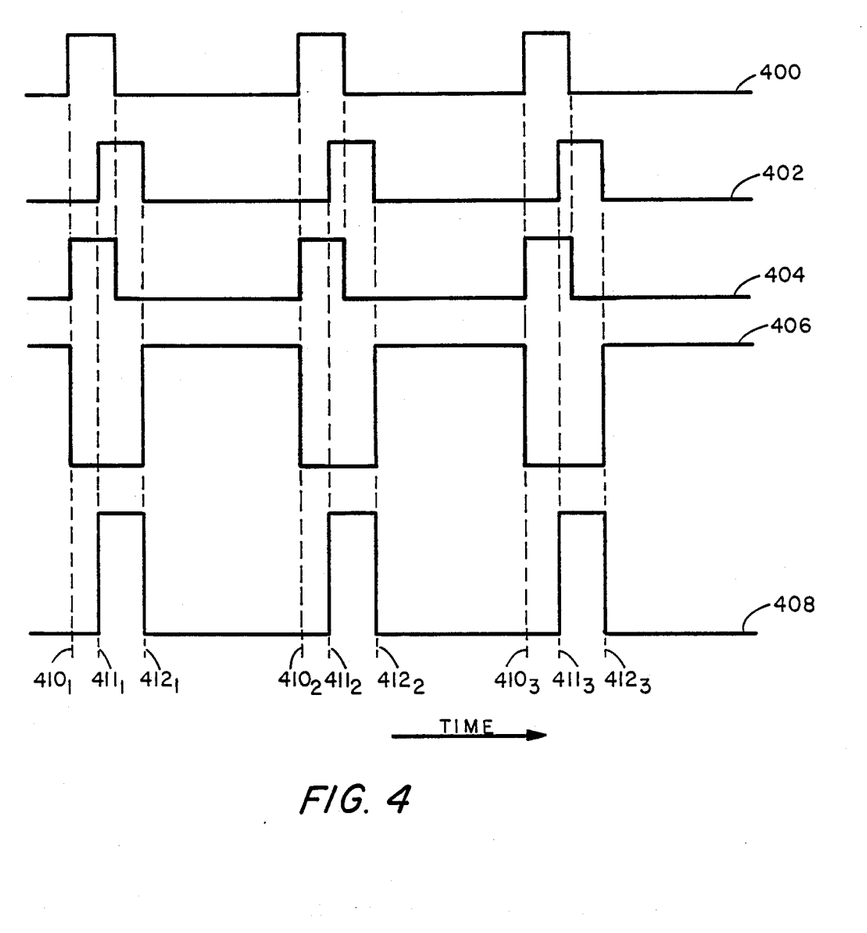
FIG. 4 is a sketch showing the relative timing of voltage pulses in the high voltage pulse generator represented by the block diagram of FIG. 1.

FIG. 4 shows the pulse trains used to drive ON switch 36 and OFF switch 38 (FIG. 2) which are used with the present invention to avoid the problems of simultaneous conduction while still allowing fast switching between the $+300$ V and $-300$ V supplies. As a reference, pulse train 400 is the output of drive circuit 24 (FIG. 1). Pulse train 402 is the output of adjustable delay line 30 (FIG. 1). Pulse train 402 is almost identical to pulse train 400, but each pulse in pulse train 402 occurs a fixed delay later than the pulses in pulse train 400. Pulse train 404 is the output of delay line bypass 32 (FIG. 1) which, too, is almost identical to pulse train 400. Pulse train 406 is the output of power amplifier 28B (FIG. 1). There is an inverted pulse lasting during an interval when there is a pulse in either pulse train 402 or pulse train 404. Pulse train 408 is the output of power amplifier 28A. It is very similar to pulse train 400, but amplified and delayed largely because of the propagation delays of fiber optic link 26 (FIG. 1).

Pulse train 406 also represents the control signal to OFF switch 38 (FIG. 1). Pulse train 408 also represents the control signal to ON switch 36 (FIG. 1). Thus, times $411_1$, $411_2$, $411_3$ represent the times at which the output $V_o$ switches from $-300$ V to $+300$ V (i.e. a low-to-high transition).

It may be seen in FIG. 4 that between times $410_1$, $410_2$, $410_3$, $411_1$, $411_2$, $411_3$ immediately preceding each low-to-high transition the voltage i.e., (rising edge) of the voltage on the output line $V_o$ (FIG. 1) neither the signal driving OFF switch 38 nor the signal driving ON switch 36 is high. Nonetheless, the voltage on the output line $V_o$ (FIG. 2) is still at $-300$ V during each interval because the output line $V_o$ is connected to the $-300$ V supply through $R_{63}$ (FIG. 2). Resistor $R_{63}$ (FIG. 2) has a sufficiently large resistance that when ON switch 36 (FIG. 2) closes, very little current flows through $R_{63}$ (FIG. 2). A fast rise time on output line $V_o$ (FIG. 2) is thus produced during the low-to-high transition because very little current flows through OFF switch 38 (FIG. 2) during the switching (i.e., simultaneous conduction of both switches is eliminated on the rising edge of the output pulse). Thus, resistor $R_{63}$ improves the switching time for a low-to-high transition of output line $V_o$ by allowing OFF switch 38 to be opened before ON switch 36 closes while still maintaining the desired voltage on output line $V_o$.

The time required for a high-to-low transistor (i.e., falling edge) is also very small because of the relative timings of the pulse trains in FIG. 4. At each of the times $412_1$, $412_2$, $412_3$, the falling edges of the pulses in pulse train 402 coincide with the falling edges of the inverted pulses of pulse train 406 and coincide with the falling edge of pulses in pulse train 408. The coincidence intentionally occurs because the delay in adjustable delay line 30 (FIG. 1) is set to make the falling edge of pulses in pulse train 402 occur at the same time as the falling edge of pulses in pulse train 408. By appropriate selection of the delay in adjustable delay line 30 (FIG. 1), then, the control signal to close OFF switch 38 is applied almost simultaneously with the control signal to open ON switch 36 such that the time required for a high-to-low transition of output line $V_o$ (FIG. 1) is minimized.

Even though control signals are applied simultaneously, a brief instant of simultaneous conduction of both switches 36 and 38 may occur due to the finite switching time of MOSFETS $Q_1$, $Q_2$, $Q_3$ and $Q_4$. However, the negative effects of such simultaneous conduction are reduced by resistors $R_{27}$ and $R_{28}$. At that instant, OFF switch 38 (FIG. 2) must sink any current flowing through ON switch 36 along with any current from utilization device 52 (FIG. 1). Damage might result to MOSFETs $Q_2$ and $Q_4$ if the power inherent in the current flow from both sources were to be dissipated in such MOSFETS. Thus, as shown in FIG. 2, resistors $R_{27}$ and $R_{28}$ are disposed in series with MOSFETS $Q_2$ and $Q_4$ to dissipate some power during any period of simultaneous conduction of the OFF switch 38 and the ON switch 36.

Turning to FIG. 3A, more details of power amplifier 28A (FIG. 1) can be seen. This circuit is referenced to the output line $V_o$ and is powered by the $+16$ V supply d.c. referenced to the output line. Thus, MOSFETs $Q_5$, $Q_6$ and $Q_9$ can be relatively common components which can switch voltages on the order of 16 volts at high switching speeds. Resistors $R_{10}$, $R_{11}$, $R_{12}$, $R_{14}$, $R_{15}$, $R_{16}$ and $R_{17}$ and diode $D_6$ bias MOSFETS $Q_5$, and $Q_9$. Coupling between the MOSFETs is provided by resistors $R_{62}$, capacitors $C_{11}$ and $C_{12}$. Driver $U_1$ is a relatively common component such as a DS0026 driver manufactured by National Semiconductor of Santa Clara, Calif. Resistor $R_{61}$ and diode $D_8$ connect driver $U_1$ to the 16 V source. Resistor $R_{18}$ and capacitor $C_{15}$ couple the input signal $V_3$ to driver $U_1$.

It should be noted that FIG. 1 shows power amplifier 28A receiving an input signal from fiber optic link 26. In FIG. 3A input signal $V_3$ is an electrical signal. The circuitry needed to convert the light signals on fiber optic link 26 (FIG. 1) is not explicitly shown. However, such circuitry is well known. Here, part number QFBR-2496 from Hewlett-Packard of Palo Alto, Calif. is used.

Figure 3B:
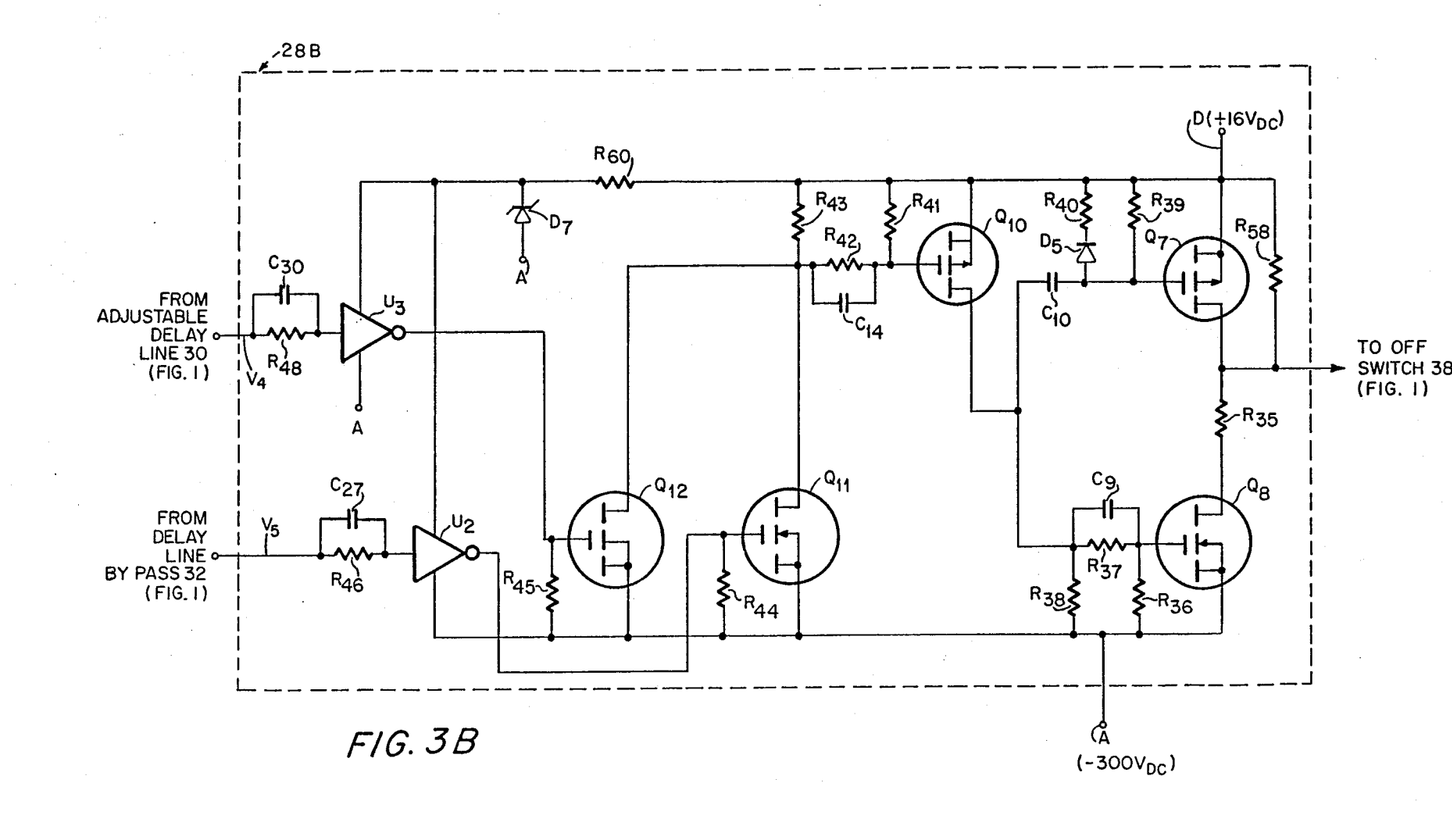
FIG. 3B is a simplified schematic of the power amplifier 28B shown in FIG. 1.

FIG. 3B shows the circuitry of power amplifier 28B (FIG. 1) in greater detail. That circuitry is referenced to −300 V supply A. All points labeled "A" in the diagram connect to the −300 V supply. The circuit is powered by a 16 V supply D referenced to the −300 V supply. MOSFETS $Q_7$, $Q_8$, $Q_{10}$, $Q_{11}$ and $Q_{12}$ are biased by $R_{35}$, $R_{36}$, $R_{38}$, $R_{39}$, $R_{40}$, $R_{41}$, $R_{43}$, $R_{44}$, $R_{45}$ and diode $D_5$. Coupling between the MOSFETs is provided by resistors $R_{37}$, $R_{42}$ and capacitors $C_9$, $C_{10}$ and $C_{14}$. Resistor $R_{58}$ ensures the output of power amplifier 28B is high except when $Q_8$ is conducting. Drivers $U_2$ and $U_3$ are of the same construction as driver $U_1$ (FIG. 3A). Resistors $R_{48}$, $R_{46}$ and capacitors $C_{27}$ and $C_{30}$ couple the input signals $V_4$ and $V_5$ to drivers $U_2$ and $U_3$. The bias voltages for drivers $U_2$ and $U_3$ come from the 16 V supply through resistor $R_{60}$ and diode $D_7$.

In actually constructing a circuit from FIGS. 2, 3A and 3B one should employ standard electrical engineering design practices to select component values. In particular, when selecting MOSFETS $Q_5$, $Q_6$, $Q_7$, $Q_8$, $Q_9$, $Q_{10}$, $Q_{11}$ and $Q_{12}$ the gate capacitance should be minimized in order to obtain good performance at high pulse repetition frequencies. For example, in accordance with good design practice for high frequency circuits, all voltage supplies should be bridged by filtering capacitors. Here, metalized polypropolyne capacitors were used.

Having described one embodiment of a high voltage, high pulse repetition frequency pulse generator incorporating the above-described inventive concepts, one of skill in the art will recognize that numerous other embodiments might be constructed. It is felt, therefore, that this invention should not be restricted to the disclosed embodiment, but rather should be limited only by the spirit and scope of the appended claims.

What is claimed is:

1. An apparatus for generating pulses on an output line for application to the controlling element of a microwave power tube, comprising:
   (a) a positive voltage source;
   (b) a negative voltage source;
   (c) a first switch means, coupled to the output line and the positive voltage source, for connecting the output line to the positive voltage source in response to a first control signal having a voltage level corresponding to a logic high and for disconnecting the output line from the positive voltage source in response to the first control signal having a voltage level corresponding to a logic low;
   (d) a second switch means, coupled to the output line and the negative voltage source, for connecting the output line to the negative voltage source in response to a second control signal having a voltage level corresponding to a logic high and for disconnecting the output line from the negative supply in response to the second control signal having a voltage level corresponding to a logic low; and
   (e) means, coupled to the first switch means and to the second switch means, for generating the first and second control signals such that the second control signal has the voltage level corresponding to a logic low when the first control signal has the voltage level corresponding to a logic high and during an interval of time immediately preceding the time when the first control signal assumes the voltage level corresponding to a logic high.

2. Circuitry for creating high voltage pulses on an output line comprising:
   (a) means for producing a low voltage signal containing pulses having voltage levels corresponding to a logic low and to a logic high;
   (b) means, responsive to the low voltage pulse producing means, for producing a first control signal having a first level and a second level and for producing a second control signal having a third level and a fourth level, such second control signal having the fourth level when the first control signal has the first level, and such second control signal also having the fourth level during portions of the interval when the first control signal has the second level; and
   (c) switching means, responsive to the first control signal and second control signals for connecting the output line to a first voltage source when the first control signal has the first level and for connecting the output line to a second voltage source when the second control signal has the third level.

3. The circuitry for creating high voltage pulses as in claim 2 wherein the means for producing control signals comprises:
   (a) driver means, responsive to the low voltage pulse producing means, for producing an output signal having a voltage level corresponding to a logic high when the low voltage signal has a voltage corresponding to a logic high and having a voltage level corresponding to a logic low when the low voltage signal has a voltage corresponding to a logic low;
   (b) first amplifier means, responsive to one of the output signals from the driver means, for producing the first control signal having the first voltage level a specified delay after the output signal of the driver means has the logic high voltage level and having the second voltage level the specified delay after the output of the driver means has the logic low voltage level; and
   (c) pulse stretching means, responsive to the output signal of the driver means, for producing the second control signal having the fourth voltage level when the output of the driver means has the logic high voltage level and the third voltage level the specified delay after the output of the driver means has the logic low voltage level.

4. The circuitry for creating high voltage pulses as in claim 3 wherein the driver means is connected to the low voltage pulse producing means through a first fiber optic link.

5. The circuitry for creating high voltage pulses as in claim 3 wherein the first amplifier means is connected to the driver means through a second fiber optic link.

6. The circuitry for creating high voltage pulses as in claim 3 wherein the pulse stretching means comprises:
   (a) signal delay means, responsive to the driver means, having the specified delay;
   (b) bypass means, responsive to the driver means, for passing signals with substantially no delay; and
   (c) second amplifier means, responsive to the signal means and bypass means, for producing the second control signal having the fourth voltage level when the output of the signal delay means has a voltage corresponding to a logic high and when the output of the bypass means has a voltage corresponding to a logic high and having the fourth voltage level when the outputs of the signal delay means and the bypass means simultaneously have values corresponding to logic lows.

7. The circuitry for creating high voltage pulses as in claim 6 wherein the switching means comprises:
(a) first transistor switch means responsive to the first control signal for connecting the output line to the first voltage source when the first control signal has the first level and for disconnecting the output line from the first voltage source when the first control signal has the second voltage level; and
(b) second transistor switch means, responsive to the second control signal, for connecting the output line to the second voltage source when the second control signal has the third level and for disconnecting the output line from the second voltage source when the second control signal has the fourth voltage level.

8. The circuitry for creating high voltage pulses as in claim 7 wherein the first and second transistor switch means comprise a plurality of MOSFET transistors connected in parallel.

9. The circuitry for creating high voltage pulses as in claim 8 wherein a resistor is connected between the output line and the second voltage source.

* * * * *